United States Patent
Ma et al.

(10) Patent No.: US 12,332,316 B2
(45) Date of Patent: Jun. 17, 2025

(54) STATE OF CHARGE DETERMINATION METHOD AND APPARATUS FOR BATTERY SYSTEM

(71) Applicant: CALB Co., Ltd., Jiangsu (CN)

(72) Inventors: Ruijun Ma, Changzhou (CN); Qiang Yun, Changzhou (CN); Fangfang Pan, Changzhou (CN); Kui Li, Changzhou (CN)

(73) Assignee: CALB Co., Ltd., Jiangsu (CN)

( * ) Notice: Subject to any disclaimer, the term of this patent is extended or adjusted under 35 U.S.C. 154(b) by 389 days.

(21) Appl. No.: 17/982,525

(22) Filed: Nov. 8, 2022

(65) Prior Publication Data
US 2024/0077537 A1    Mar. 7, 2024

(30) Foreign Application Priority Data

Sep. 1, 2022 (CN) .......................... 202211061485.6

(51) Int. Cl.
*G01R 31/36* (2020.01)
*G01R 31/3842* (2019.01)
*G01R 31/389* (2019.01)

(52) U.S. Cl.
CPC ..... *G01R 31/3648* (2013.01); *G01R 31/3842* (2019.01); *G01R 31/389* (2019.01)

(58) Field of Classification Search
CPC ............ G01R 31/3648; G01R 31/3842; G01R 31/389; G01R 31/382; G01R 31/367; G01R 31/3828; G01R 31/3835; G01R 31/3832; B60L 2240/547; B60L 2240/549; B60L 2240/80; B60L 58/10
See application file for complete search history.

(56) References Cited

U.S. PATENT DOCUMENTS

| | | | |
|---|---|---|---|
| 2003/0001544 A1* | 1/2003 | Nakanishi | B60L 50/16 320/162 |
| 2006/0176022 A1* | 8/2006 | Namba | G01R 31/367 320/130 |
| 2010/0121591 A1 | 5/2010 | Hall | |
| 2015/0084639 A1 | 3/2015 | Joe | |
| 2016/0202325 A1 | 7/2016 | Tang | |
| 2022/0006313 A1 | 1/2022 | Lim et al. | |

FOREIGN PATENT DOCUMENTS

| | | |
|---|---|---|
| CN | 106646265 | 5/2017 |
| CN | 107450031 | 12/2017 |
| CN | 110749826 | 2/2020 |

OTHER PUBLICATIONS

"Office Action of China Counterpart Application", issued on Oct. 19, 2022, with partial English translation thereof, p. 1-p. 9.
"Search Report of Europe Counterpart Application", issued on Aug. 23, 2023, p. 1-p. 9.

* cited by examiner

*Primary Examiner* — Tung S Lau
(74) *Attorney, Agent, or Firm* — JCIP GLOBAL INC.

(57) ABSTRACT

A state of charge (SOC) determination method and apparatus for a battery system are disclosed. Based on a correspondence between impedance and SOC, a correspondence between OCV and SOC, and an operating current at a previous data collection moment, a correction coefficient at a current data collection moment can be determined. After the SOC estimated at the current data collection moment is corrected based on the correction coefficient, the accumulation of errors in the SOC can be eliminated, and the accuracy of the determined SOC is thereby improved.

15 Claims, 3 Drawing Sheets

STATE OF CHARGE DETERMINATION METHOD AND APPARATUS FOR BATTERY SYSTEM

CROSS-REFERENCE TO RELATED APPLICATION

This application claims the priority benefit of China application serial no. 202211061485.6, filed on Sep. 1, 2022. The entirety of the above-mentioned patent application is hereby incorporated by reference herein and made a part of this specification.

BACKGROUND

Technical Field

The disclosure relates to the technical field of batteries and in particular, relates to a state of charge (SOC) determination method and apparatus for a battery system.

Description of Related Art

The state of charge (SOC) is an important parameter for evaluating the performance of the battery system, and the accurate estimation of the SOC can ensure the safe and reliable operation of the battery system. Regarding the existing SOC estimation algorithms, such as the ampere-hour integration method, the estimated SOC may have errors. Inaccurately-estimated SOC may lead to problems such as vehicle breakdown and poor user experience, and may even lead to safety issues.

SUMMARY

In the first aspect, an embodiment of the disclosure provides a SOC determination method for a battery system, and the method includes the following steps.

When a first correspondence between an open-circuit voltage (OCV) and a SOC and a second correspondence between an impedance and the SOC are determined, a correction coefficient at a current data collection moment is determined according to the first correspondence, the second correspondence, and an operating current of the battery system at a previous data collection moment.

The SOC of the battery system at the current data collection moment is determined.

Based on the correction coefficient, the SOC at the current data collection moment is corrected.

In the second aspect, an embodiment of the disclosure provides a SOC determination apparatus for a battery system, and the apparatus includes a memory and a processor.

The memory is configured to store a program instruction.

The processor is configured to call the program instruction stored in the memory and executes the determination method provided by the foregoing embodiment of the disclosure according to the obtained program.

In the third aspect, an embodiment of the disclosure provides a battery system. The SOC of the battery system is determined by using the above determination method provided by the foregoing embodiment of the disclosure.

BRIEF DESCRIPTION OF THE DRAWINGS

For a better understanding of the disclosure, reference may be made to exemplary embodiments shown in the following drawings. The components in the drawings are not necessarily to scale and related elements may be omitted, or in some instances proportions may have been exaggerated, so as to emphasize and clearly illustrate the features described herein. In addition, related elements or components can be variously arranged, as known in the art. Further, in the drawings, like reference numerals designate same or like parts throughout the several views.

DESCRIPTION OF THE EMBODIMENTS

The technical solutions in the exemplary embodiments of the disclosure will be described clearly and explicitly in conjunction with the drawings in the exemplary embodiments of the disclosure. The description proposed herein is just the exemplary embodiments for the purpose of illustrations only, not intended to limit the scope of the disclosure, so it should be understood that and various modifications and variations could be made thereto without departing from the scope of the disclosure.

In the description of the present disclosure, unless otherwise specifically defined and limited, the terms "first", "second" and the like are only used for illustrative purposes and are not to be construed as expressing or implying a relative importance. The term "plurality" is two or more. The term "and/or" includes any and all combinations of one or more of the associated listed items.

In particular, a reference to "the" object or "a" and "an" object is intended to denote also one of a possible plurality of such objects. Unless otherwise defined or described, the terms "connect", "fix" should be broadly interpreted, for example, the term "connect" can be "fixedly connect", "detachably connect", "integrally connect", "electrically connect" or "signal connect". The term "connect" also can be "directly connect" or "indirectly connect via a medium". For the persons skilled in the art, the specific meanings of the abovementioned terms in the present disclosure can be understood according to the specific situation.

Further, in the description of the present disclosure, it should be understood that spatially relative terms, such as "above", "below" "inside", "outside" and the like, are described based on orientations illustrated in the figures, but are not intended to limit the exemplary embodiments of the present disclosure.

In the context, it should also be understood that when an element or features is provided "outside" or "inside" of another element(s), it can be directly provided "outside" or "inside" of the other element, or be indirectly provided "outside" or "inside" of the another element(s) by an intermediate element.

Specific implementation of a state of charge (SOC) determination method and apparatus for a battery system provided by the embodiments of the disclosure is described in detail in combination with the accompanying drawings. Note that the described embodiments are merely part of the embodiments, rather than all of the embodiments, of the disclosure. Based on the embodiments of the disclosure, all other embodiments obtained by a person having ordinary skill in the art without making any inventive effort fall within the scope that the disclosure seeks to protect.

The embodiments of the disclosure provide a state of charge (SOC) determination method and apparatus for a battery system configured to accurately determine the SOC of the battery system.

Beneficial effects provided by the disclosure include the following.

In the SOC determination method and apparatus for a battery system provided by the disclosure, based on the correspondence between the impedance and SOC, the correspondence between the OCV and SOC, and the operating current at the previous data collection moment, the correction coefficient at the current data collection moment is determined. After the SOC estimated at the current data collection moment is corrected based on the correction coefficient, the accumulation of errors in the SOC can be eliminated, and the accuracy of the determined SOC is thereby improved.

Figure 1:
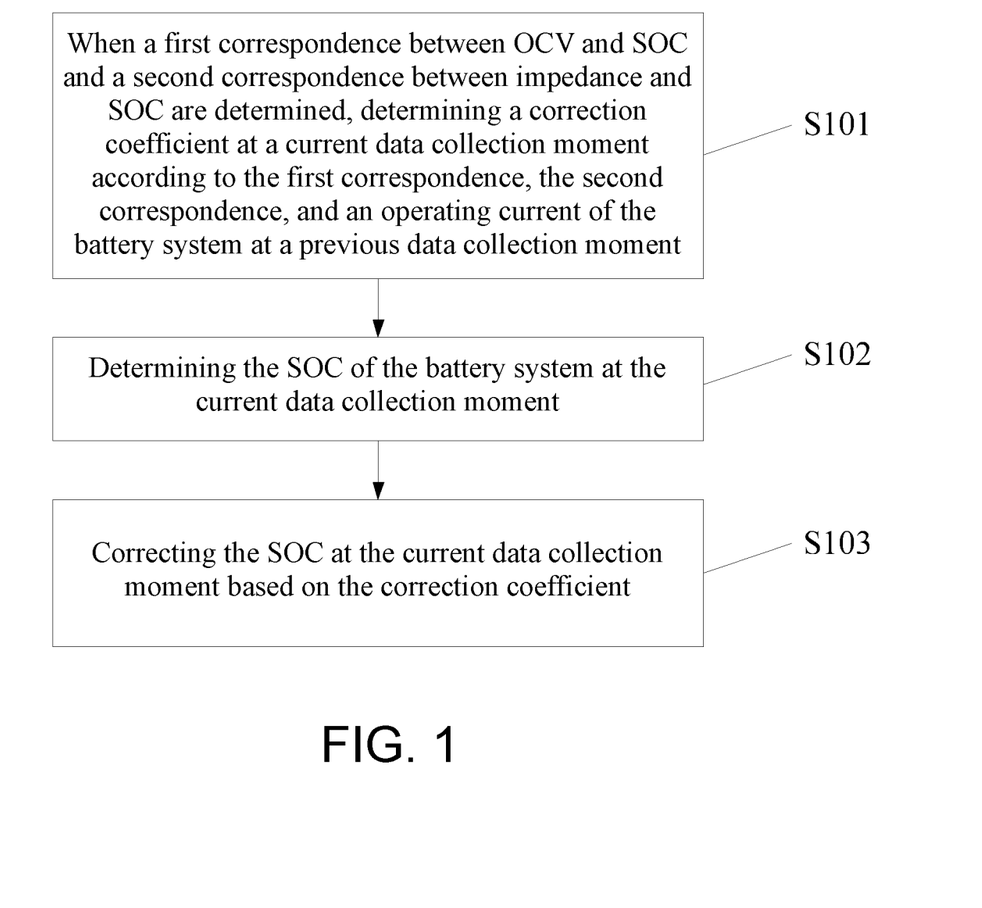
FIG. 1 is a flow chart of a state of charge (SOC) determination method for a battery system according to an embodiment of the disclosure.

An embodiment of the disclosure provides a SOC determination method for a battery system, and as shown in FIG. 1, the method includes the following steps.

In S101, when a first correspondence between open-circuit voltage (OCV) and SOC and a second correspondence between impedance and SOC are determined, a correction coefficient at a current data collection moment is determined according to the first correspondence, the second correspondence, and an operating current of the battery system at a previous data collection moment.

In some embodiments, the impedance may be polarization impedance or other types of impedance, such as but not limited to charge transfer impedance and/or diffusion impedance, etc., which may be selected according to actual needs and is not particularly limited herein.

In S102, the SOC of the battery system at the current data collection moment is determined.

In S103, based on the correction coefficient, the SOC at the current data collection moment is corrected.

In this way, based on the correspondence between the impedance and SOC, the correspondence between the OCV and SOC, and the operating current at the previous data collection moment, the correction coefficient at the current data collection moment may be determined. After the SOC estimated at the current data collection moment is corrected based on the correction coefficient, the accumulation of errors in the SOC may be eliminated, and the accuracy of the determined SOC is thereby improved.

Figure 2:
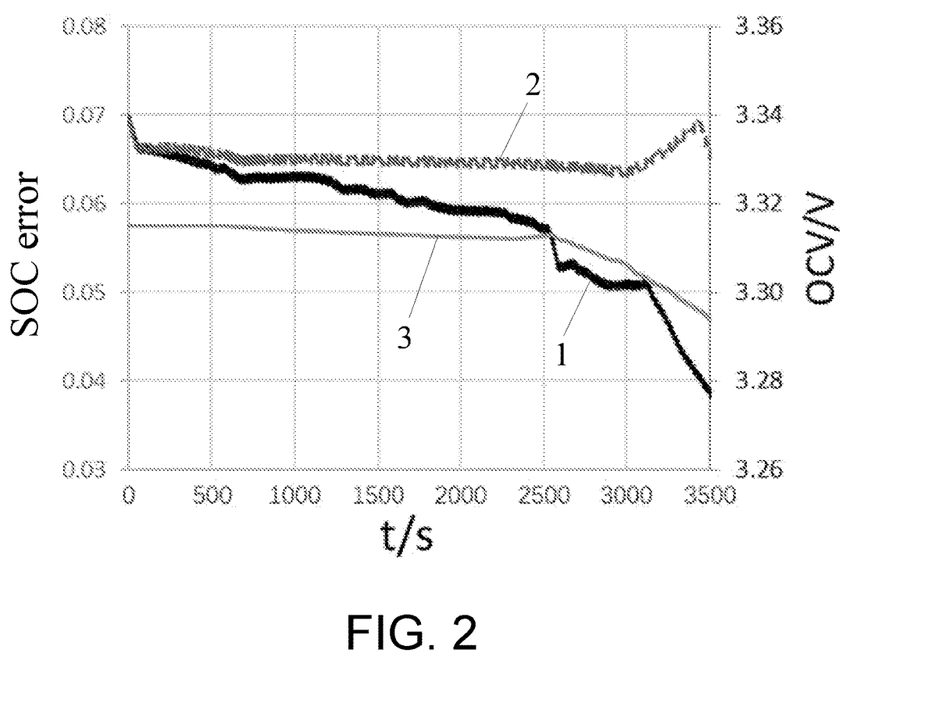
FIG. 2 is a schematic graph of SOC errors according to an embodiment of the disclosure.

For instance, in the schematic graph of the determined SOC errors shown in FIG. 2, the solid line 1 represents the change in the SOC error determined by using the technical solution provided by the embodiments of the disclosure when the battery system is discharged from 90% SOC to 0% SOC. The solid line 2 represents the change in the SOC error determined by using the related art when the battery system is discharged from 90% SOC to 0% SOC. The solid line 3 represents the OCV change of the battery system when the battery system is discharged from 90% SOC to 0% SOC. The initial error is set to +7%.

It can be seen from the figure that:
(a) In the plateau region of the OCV (i.e., 0 second(s) to 2,500 s, during which time the SOC of the battery system is reduced from 90% SOC to 68% SOC), the SOC error determined by using the related hardly converges, while the SOC error determined by using the technical solution provided by the embodiments of the disclosure converges from 7% to within 6%. In this way, when the battery system continues to work in the plateau region, the SOC error exceeding 1% may be eliminated in time by using the technical solution provided by the embodiments of the disclosure. Therefore, when the cumulative error of SOC in this plateau region is not greater than 1% due to certain factors, the SOC may maintain good accuracy.
(b) In the slope region (i.e., 2,500s to 3,500 s) of the OCV, the SOC error determined by using the technical solution provided by the embodiments of the disclosure has a faster convergence speed than the SOC error determined by using the related art. Therefore, the accuracy of the SOC determined by using the technical solution provided by the embodiments of the disclosure is higher.

Figure 3:
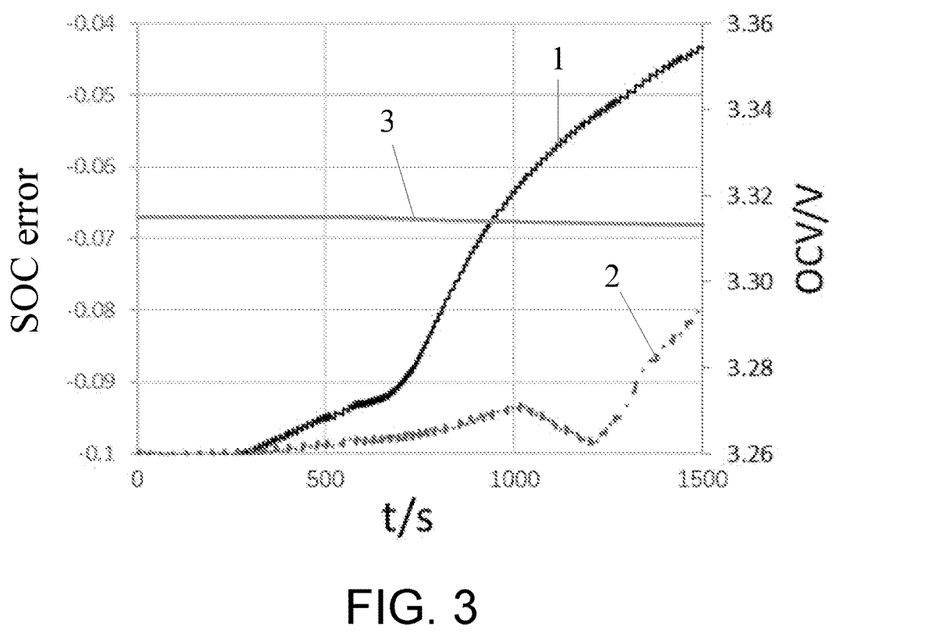
FIG. 3 is a schematic graph of SOC errors according to another embodiment of the disclosure.

For another instance, in the schematic graph of the determined SOC errors shown in FIG. 3, the solid line 1 represents the change in the SOC error determined by using the technical solution provided by the embodiments of the disclosure when the battery system is discharged from 90% SOC to 0% SOC. The solid line 2 represents the change in the SOC error determined by using the related art when the battery system is discharged from 90% SOC to 0% SOC. The solid line 3 represents the OCV change of the battery system when the battery system is discharged from 90% SOC to 0% SOC. The initial error is set to −10%.

It can be seen from the figure that:

During the discharging process of the first 1,000s (actually the SOC of the battery system drops from 90% to 80%), the SOC error determined by using the related art is reduced by less than 1% (i.e., [−0.093−(−0.1)]*100%=0.7%), while the SOC error determined by using the technical solution provided by the embodiments of the disclosure is corrected by more than 3% (i.e., [−0.063−(−0.1)]*100%=3.7%). Therefore, even if an electric vehicle always travels in the range of 90% SOC to 80% SOC, the determined SOC can still maintain good accuracy when the cumulative error caused by certain factors during this period is not greater than 3%.

In some embodiments, the determining the correction coefficient at the current data collection moment according to the first correspondence, the second correspondence, and an operating current of the battery system at the previous data collection moment includes the following.

A first change slope of OCV and SOC and a second change slope of impedance and SOC are determined according to the first correspondence and the second correspondence.

The product of the second change slope and the operating current of the battery system at the previous data collection moment is determined to obtain a second value.

The correction coefficient at the current data collection moment is determined according to the second value and the first change slope.

As such, when determining the correction coefficient, the second change slope of impedance and SOC and the operating current of the battery system at the previous data collection moment may be introduced. In this way, in the plateau region of the OCV, when the second change slope of the impedance and the SOC is not 0, the correction coefficient may be increased. When the second change slope of impedance and change range of the operating current is relatively large, the SOC error may be quickly corrected, and the accuracy of the determined SOC may thus be significantly improved.

Further, by introducing the second change slope of impedance and SOC and the operating current of the battery system at the previous data collection moment, when the battery system works in the OCV plateau region, the SOC error of the battery system may be effectively corrected, the SOC error is eliminated, and the accumulation of the SOC error is prevented from occurring, and the accuracy of the determined SOC is thereby improved.

In some embodiments, the determining the correction coefficient at the current data collection moment according to the second value and the first change slope further includes the following.

The correction coefficient at the current data collection moment is determined through the following formulas:

$$p = \int \left[ \frac{\partial OCV}{\partial SOC} + (1-f) \times I_{k-1} \times \frac{\partial R}{\partial SOC} \right],$$

$$f = \exp(T/\tau),$$

where p represents the correction coefficient at the current data collection moment, $I_{k-1}$ represents the operating current of the battery system at the previous data collection moment, $$\frac{\partial OCV}{\partial SOC}$$

represents the first change slope, $$\frac{\partial R}{\partial SOC}$$

represents the second change slope, T represents the time period between two adjacent data collection moments, τ represents the time constant of resistor-capacitor (RC) loops included in an equivalent circuit of the battery system, and $$I_{k-1} \times \frac{\partial R}{\partial SOC}$$

represents the second value.

In this way, the correction coefficient at the current data collection moment may be determined according to the above formulas, so that the estimated SOC may be subsequently corrected using the correction coefficient, and the accuracy of the finally determined SOC may be improved.

In some embodiments, based on the correction coefficient, the correcting the SOC at the current data collection moment includes the following.

The OCV corresponding to the determined SOC is looked up from the first correspondence, and the impedance corresponding to the determined SOC is looked up from the second correspondence.

An estimated voltage of the battery system at the current data collection moment is determined according to the looked-up OCV and impedance.

The difference between the estimated voltage of the battery system at the current data collection moment and an actual measured voltage is calculated.

The product of the difference and the correction coefficient is calculated to obtain a first value.

According to the first value, the SOC at the current data collection moment is corrected.

Herein, when determining the estimated voltage of the battery system at the current data collection moment according to the looked-up OCV and impedance, the estimated voltage may be obtained by, for example but not limited to, the Kalman filter algorithm.

In this way, the SOC estimated at the current data collection moment may be corrected based on the difference between the estimated voltage of the battery system at the current data collection moment and the measured voltage as well as the correction coefficient, so that the accuracy of the SOC may be improved.

In some embodiments, according to the first value, the correcting the SOC at the current data collection moment includes the following.

The sum of the first value and the SOC at the current data collection moment is calculated.

For instance, the following formula may be used to correct the SOC at the current data collection moment:

$$SOC^* = SOC + p \times (U_{measured} - U_{estimated}),$$

where $U_{measured}$ represents the measured voltage of the battery system at the current data collection moment, $U_{estimated}$ represents the estimated voltage of the battery system at the current data collection moment, and SOC represents the estimated SOC at the current data collection moment, p represents the correction coefficient, and $p \times (U_{measured} - U_{estimated})$ represents the first value.

In some embodiments, the following may further be included.

The OCV corresponding to the corrected SOC is looked up from the first correspondence, and the impedance corresponding to the corrected SOC is looked up from the second correspondence.

According to the looked-up OCV and impedance, the state of power (SOP) of the battery system at the current data collection moment is determined.

Since the corrected SOC is more accurate and the error is smaller, the SOP determined based on this is also more accurate. The lithium deposition phenomenon caused by the unreasonable charging current caused by the large SOP error due to the large SOC error is prevented from occurring, the service life of the battery system is thereby prolonged, and the safety of the battery system is improved.

In some embodiments, according to the looked-up OCV and impedance, the determining the SOP of the battery system at the current data collection moment may specifically include the following.

Based on the following formula, the SOP of the battery system at the current data collection moment is calculated:

$$SOP = (OCV - U_{min}) / \left[ \sum_{i=0}^{i} Ri \times U_{min} \right],$$

where $U_{min}$ represents the minimum voltage of the battery system, OCV represents the OCV looked up from the first dynamic correspondence, for $$\sum_{i=0}^{i} Ri, \sum_{i=0}^{i} Ri = R0 + \sum_{i=1}^{i} Ri,$$

where R0 represents the impedance looked up from the second dynamic correspondence, i represents the number of RC loops included in the equivalent circuit of the battery system, $$\sum_{i=0}^{i} Ri$$

represents the sum of the impedances of i RC loops in the equivalent circuit of the battery system, and the value of i may be 0 or a positive integer.

In this way, the SOP of the battery system at the current data collection moment may be estimated based on the above method because the looked-up OCV and impedance are looked up from the first dynamic correspondence and the second dynamic correspondence. Further, the first dynamic correspondence and the second dynamic correspondence are related to the operating condition, so the looked-up OCV and impedance are closer to the real situation of the battery system. As such, the estimated SOP is also more in line with the real situation of the battery system, and the accuracy of the estimated SOP is thereby improved.

In some embodiments, the first correspondence may be: a static correspondence between OCV and SOC (i.e., a third correspondence to be provided in the following paragraphs). The static correspondence is independent of the operating condition, so the static correspondences under different operating conditions are the same.

The second correspondence may be: a static correspondence between impedance and SOC (i.e., a fourth correspondence to be provided in the following paragraphs). The static correspondence is independent of the operating condition, so the static correspondences under different operating conditions are the same.

In this way, the correspondences may be simplified, and the complexity of determining the correspondences is reduced.

Certainly, in some embodiments, the first correspondence may further be: the first dynamic correspondence among the operating condition, OCV, and SOC, and the second correspondence may further be the second dynamic correspondence among the operating condition, impedance, and SOC.

In this way, each operating condition may be taken into account, the OCV change and impedance change of the battery system under different operating conditions may be effectively tracked, the sensitivity of OCV and impedance to SOC changes is increased, and the SOC plateau where OCV and impedance are not sensitive to SOC changes is eliminated, so that the accuracy of the determined SOC may be further improved.

Therefore, in some embodiments, the first correspondence may be: the first dynamic correspondence among the current operating condition, OCV, and SOC determined according to lithium intercalation amounts of a plurality of predetermined positions in an active material of the battery system in the current operating condition.

The second correspondence may be: the second dynamic correspondence among the current operating condition, impedance, and SOC determined according to the lithium intercalation amounts of the plurality of predetermined positions in the active material of the battery system in the current operating condition.

Herein, the first dynamic correspondences corresponding to different operating conditions are different, and the second dynamic correspondences corresponding to different operating conditions are different.

Further, each predetermined position may be understood as a certain position between the surface and the interior of the active material particles.

The first dynamic correspondence and the second dynamic correspondence are determined according to the lithium intercalation amounts in the predetermined positions in the active material of the battery system in the current operating condition. In this way, the OCV change and impedance change of the battery system under the current operating condition may be effectively tracked, the sensitivity of OCV and impedance to SOC changes is increased, and the SOC plateau where OCV and impedance are not sensitive to SOC changes is eliminated, so that the accuracy of the determined SOC may be further improved.

The processes of determining the first dynamic correspondence and the second dynamic correspondence are described below.

I. The Process of Determining the First Dynamic Correspondence

In some embodiments, according to the lithium intercalation amounts of the predetermined positions in the active material of the battery system in the current operating condition, the determining the first dynamic correspondence among the current operating condition, OCV, and SOC further includes the following.

When the operating condition includes at least one of the data collection moments, according to the SOC of the battery system at the initial moment of the current operating condition and characteristic parameters used to characterize the characteristics of the active material and an electrode structure, the SOC corresponding to the lithium intercalation amount of each of the predetermined positions at each of the data collection moments under the current operating condition is determined. Herein, the predetermined positions are determined according to the particle size of the active material, the particle size distribution of the particles, and the kinetic parameters of the active material. The characteristic parameters include: particle size distribution of active material particles, specific surface area of active material particles, gram capacity of active material particles, particle shape, solid-phase ion diffusion coefficient of active material, electronic conductivity of active material, interface exchange current density, ratio of negative electrode capacity to positive electrode capacity, electrode porosity and tortuosity, battery capacity (a parameter used to calculate battery capacity), gram capacity of positive and negative materials, voltage window, etc.

According to the SOC corresponding to the lithium intercalation amount of each of the predetermined positions at each of the data collection moments under the current operating condition, an equivalent SOC of the battery system corresponding to each of the data collection moments in the current operating condition is determined.

According to the equivalent SOC of the battery system corresponding to each of the data collection moments in the current operating condition, the first dynamic correspondence among the current operating condition, OCV, and SOC is determined.

The number of predetermined positions may be set according to actual needs, which is not particularly limited herein.

In this way, based on the lithium intercalation amount at each predetermined position, the changes of the active material and electrode structure under the current operating condition may be simulated, and the OCV change of the battery system under the current operating condition may thus be effectively tracked. The first dynamic correspondence is thereby established, and the OCV which is looked up based on the first dynamic correspondence may be more in line with the real OCV of the battery system, so that the estimation accuracy of the SOP is improved.

In some embodiments, the number of data collection moments included in the operating condition may be large, that is, the time gap between two adjacent data collection moments may be set to be short. In this way, the change of SOC may be intensively monitored under operating condition, and the change of SOC may be acquired in real time and effectively, so as to know the change of the operating state of the battery system.

In some embodiments, according to the SOC of the battery system at the initial moment of the current operating condition and the characteristic parameters used to characterize the characteristics of the active material and the electrode structure, the determining the SOC corresponding to the lithium intercalation amount of each of the predetermined positions at each of the data collection moments under the current operating condition further includes the following.

According to the characteristic parameters used to characterize the characteristics of the active material and the electrode structure, a charge distribution rule for each of the predetermined positions is determined.

When the current operating condition includes one data collection period, a time period between the initial moment of the current operating condition and the data collection moment is defined as a data collection period. When the current operating condition includes a plurality of the data collection moments, both the time periods between the initial moment of the current operating condition and the first data collection moment and between any adjacent two data collection moments are defined as the data collection period. A total charge change amount during each of the data collection periods in the current operating condition is determined.

According to the total charge change amount during each of the data collection periods in the current operating condition and the charge distribution rule of each of the predetermined positions, a charge change amount of each of the predetermined positions during each of the data collection periods in the current operating condition is determined.

According to the SOC of the battery system at the initial moment of the current operating condition and the charge change amount of each of the predetermined positions during each of the data collection periods in the current operation condition, the SOC corresponding to the lithium intercalation amount of each of the predetermined positions at each of the data collection moments under the current operating condition is determined.

Herein, the characteristic parameters characterize the characteristics of the active material and the electrode structure. Therefore, a degree of contribution of each of the predetermined positions to the SOC of the battery system may be determined based on the characteristics of the active material and the electrode structure as well as the positional relationship between the predetermined positions and the active material and the electrode structure, and then a charge ratio assigned to each of the predetermined positions may be determined.

For instance, it is assumed that there are three predetermined positions, denoted as position A, position B, and position C. If the degree of contribution of position A to the SOC of the battery system is a %, the degree of contribution of position B to the SOC of the battery system is b %, the degree of contribution of position C to the SOC of the battery system is c %, and a+b+c is 100, correspondingly, the charge distribution ratio of position A may be a %, the charge distribution ratio of position B may be b %, and the charge distribution ratio of position C may be c %.

In some embodiments, the operating condition is the operating state of the battery system within a period of time, so the operating condition may include at least one data collection moment. A voltage and an operating current may be collected at each data collection moment, and then the change of the operating current between each data collection moment and the corresponding previous data collection moment may be calculated, so that the total charge change amount of each data collection moment may be determined.

The charge ratio assigned to each of the predetermined positions is determined, and the total charge change amount corresponding to each of the data collection periods in the current operating condition is determined. Therefore, for any predetermined position during any data collection period, the product of the charge distribution ratio and the total charge change amount is the charge change amount of the predetermined position during the data collection period. Since the SOC represents the available state of the remaining charge in the battery system, a certain correspondence is provided between the SOC and the charge. As such, when the SOC at the initial moment of the current operating condition is known, the SOC corresponding to the lithium intercalation amount of the predetermined position at each of the data collection moments may be determined in combination with the charge change amount of the predetermined position during the data collection period.

In some embodiments, according to the SOC corresponding to the lithium intercalation amount of each of the predetermined positions at each of the data collection moments under the current operating condition, the determining the equivalent SOC of the battery system corresponding to each of the data collection moments in the current operating condition includes the following.

The following processes are performed for any of the data collection moments.

According to a predetermined first weight distribution rule, a weight is assigned to the SOC corresponding to the lithium intercalation amount of each of the predetermined positions at the data collection moment. The product of the SOC corresponding to the lithium intercalation amount of each of the predetermined positions at the data collection moment and the corresponding weight is calculated. The sum of the products corresponding to the predetermined positions at the data collection moment is calculated to obtain the first value. The first value is treated as the first equivalent SOC of the battery system corresponding to the data collection moment.

According to a predetermined second weight distribution rule, a weight is assigned to the SOC corresponding to the lithium intercalation amount of each of the predetermined positions at the data collection moment. The product of the SOC corresponding to the lithium intercalation amount of each of the predetermined positions at the data collection moment and the corresponding weight is calculated. The sum of the products corresponding to the predetermined positions at the data collection moment is calculated to obtain the second value. The second value is treated as the second equivalent SOC of the battery system corresponding to the data collection moment.

For instance, taking three predetermined positions as an example, the SOCs corresponding to the lithium intercalation amount at any data collection moment of the three predetermined positions are denoted as SA, SB, and SC.

Through the first weight distribution method, the weights assigned to the three predetermined positions at the data collection moment are w1, w2, and w3, and the first equivalent SOC (which can be represented by SOCa) corresponding to the data collection moment herein is: w1×SA+w2×SB+w3×SC. Through the second weight distribution method, the weights assigned to the three predetermined positions at the data collection moment are u1, u2, and u3, and the second equivalent SOC (which can be represented by SOCb) corresponding to the data collection moment herein is:

$$u1 \times SA + u2 \times SB + u3 \times SC.$$

In some embodiments, when weights are assigned to SOCs, no matter it is each data collection moment in the operating condition or the data collection moments in different operating conditions, the first weight distribution rule may be the same or different. Similarly, the second weight distribution rule may be the same or different.

In some embodiments, the first weight distribution rule is determined according to the degree of contribution of each of the predetermined positions to the SOC of the battery system.

The second weight distribution rule is determined according to the degree of influence of each of the predetermined positions on the electrochemical reaction of the battery system.

In this way, weights may be assigned to the SOC of each of the predetermined positions from two perspectives, the degree of contribution to the SOC and the degree of influence on the electrochemical reaction. Two equivalent SOCs are obtained after weighting, so that the OCV corresponding to the current operating condition is subsequently determined based on the two equivalent SOCs, and then the first dynamic correspondence is determined.

In some embodiments, according to the equivalent SOC of the battery system corresponding to each of the data collection moments in the current operating condition, the determining the first dynamic correspondence among the current operating condition, OCV, and SOC further includes the following.

When the equivalent SOC includes the first equivalent SOC and the second equivalent SOC, from the predetermined third correspondence between OCV and SOC, a charging OCV in a charging process and a discharging OCV in a discharging process corresponding to the first equivalent SOC at each of the data collection moments in the current operating condition are looked up. The third correspondences under different operating conditions are the same.

According to the second equivalent SOC corresponding to each of the data collection moments in the current operating condition, weights are assigned to the charging OCV and the discharging OCV.

The product of the charging OCV and the corresponding weight are calculated to obtain a third value, and the product of the discharging OCV and the corresponding weight are calculated to obtain a fourth value.

The sum of the third value and the fourth value are treated as the OCV corresponding to each of the data collection moments in the current operating condition.

When the SOC at each of the data collection moments in the current operating condition is determined, the first dynamic correspondence among the current operating condition, OCV, and SOC is established.

That is, when the operating condition includes one data collection moment, a pair of correspondences between OCV and SOC under the operating condition is provided. When the operating condition includes multiple (i.e., at least two) data collection moments, multiple pairs of correspondences between OCV and SOC under the operating condition are provided.

In this way, the correspondence between the OCV and SOC at each of the data collection moments in the current operating condition may be determined, accurate data is thereby provided for subsequent SOC estimation and SOP estimation, and the accuracy of estimation results is thus improved.

For instance, it is assumed that the operating condition includes four data collection moments. Taking one of the data collection moments in the current operating condition as an example, from the third correspondence between OCV and SOC (as shown in Table 1 below), the charging OCV (e.g., Uc2) and the discharging OCV (e.g., Ud2) corresponding to the first equivalent SOC (assumed to be SOC2) at the data collection moment are looked up. It is assumed that the weight assigned to Uc2 is w1, and the weight assigned to Ud2 is w2, then, the OCV corresponding to the data collection moment is w1×Uc2+w2×Ud2.

TABLE 1

| Charging OCV | Discharging OCV | SOC |
|---|---|---|
| Uc1 | Ud1 | SOC1 |
| Uc2 | Ud2 | SOC2 |
| . . . | . . . | . . . |
| Ucm | Udm | SOCm |

When the SOC (represented by SOCf) at the data collection moment is calculated by, for example but not limited to, the ampere-hour integration method, the correspondence between the OCV and SOC corresponding to the data collection moment may be established.

By combining the correspondences at the data collection moments, the first dynamic correspondence among the current operating condition (e.g., the operating condition 1 in Table 2), OCV, and SOC may be formed, as shown in Table 2 below.

TABLE 2

| Operating Condition | Data Collection Moment | OCV | SOC |
|---|---|---|---|
| Operating Condition 1 | T11 | U1 | SOC1 |
|  | T12 | U2 | SOC2 |
|  | T13 | U3 | SOC3 |
|  | T14 | U4 | SOC4 |

In some embodiments, according to the second equivalent SOC corresponding to each of the data collection moments in the current operating condition, the assigning the weights to the charging OCV and the discharging OCV includes the following.

The following processes are performed for any of the data collection moments.

Weights are assigned to the charging OCV and the discharging OCV according to the following relations:

$$w1 = k1 \times SOCb + b1,$$

$$w2 = -k1 \times SOCb + (1-b1),$$

where w1 represents the weight corresponding to the charging OCV, w2 represents the weight corresponding to the discharging OCV, k1 and b1 are constants, and SOCb represents the second equivalent SOC at the data collection moment.

Further, the values of k1 and b1 may be set according to actual needs, which are not particularly limited herein.

II. The Process of Determining the Second Dynamic Correspondence

In some embodiments, according to the lithium intercalation amounts of the plurality of predetermined positions in the active material of the battery system in the current operating condition, the determining the second dynamic correspondence among the current operating condition, impedance, and SOC further includes the following.

When the operating condition includes at least one of the data collection moments, according to the SOC of the battery system at the initial moment of the current operating condition and characteristic parameters used to characterize the characteristics of the active material and an electrode structure, the SOC corresponding to the lithium intercalation amount of each of the predetermined positions at each of the data collection moments under the current operating condition is determined. Herein, the predetermined positions are determined according to the particle size of the active material, the particle size distribution of the particles, and the kinetic parameters of the active material.

According to the SOC corresponding to the lithium intercalation amount of each of the predetermined positions at each of the data collection moments under the current operating condition, an equivalent SOC of the battery system corresponding to each of the data collection moments in the current operating condition is determined.

According to the equivalent SOC of the battery system corresponding to each of the data collection moments in the current operating condition, the second dynamic correspondence among the current operating condition, impedance, and SOC is determined.

In this way, based on the lithium intercalation amount at each predetermined position, the changes of the active material and electrode structure under the current operating condition may be simulated, and the impedance change of the battery system under the current operating condition may thus be effectively tracked. The second dynamic correspondence is thereby established, and the impedance which is looked up based on the second dynamic correspondence may be more in line with the real impedance of the battery system, so that the estimation accuracy of the SOP is improved.

In some embodiments, regarding the determining the SOC corresponding to the lithium intercalation amount of each of the predetermined positions at each of the data collection moments under the current operating condition according to the SOC of the battery system at the initial moment of the current operating condition and the characteristic parameters used to characterize the characteristics of the active material and the electrode structure, as well as regarding the determining the equivalent SOC of the battery system corresponding to each of the data collection moments in the current operating condition according to the SOC corresponding to the lithium intercalation amount of each of the predetermined positions at each of the data collection moments under the current operating condition, the implementation principle thereof is similar to the content provided in the related foregoing paragraphs. Description of the specific implementation may be found with reference to the specific embodiments of the related foregoing paragraphs and thus is not repeated herein.

In some embodiments, according to the equivalent SOC of the battery system corresponding to each of the data collection moments in the current operating condition, the determining the second dynamic correspondence among the current operating condition, impedance, and SOC further includes the following.

When the equivalent SOC includes the first equivalent SOC and the second equivalent SOC, from the predetermined fourth correspondence between the impedance and SOC, a charging impedance in a charging process and a discharging impedance in a discharging process corresponding to the first equivalent SOC at each of the data collection moments in the current operating condition are looked up. Herein, the fourth correspondences under different operating conditions are the same.

According to the second equivalent SOC corresponding to the current operating condition, weights are assigned to the charging impedance and the discharging impedance.

The product of the charging impedance and the corresponding weight are calculated to obtain a third value, and the product of the discharging impedance and the corresponding weight are calculated to obtain a fourth value.

The sum of the third value and the fourth value are treated as the impedance corresponding to each of the data collection moments in the current operating condition.

When the SOC at each of the data collection moments in the current operating condition is determined, second dynamic correspondence among the current operating condition, impedance, and SOC is established.

That is, when the second dynamic correspondence is determined according to the equivalent SOC of the battery system corresponding to each of the data collection moments in the current operating condition, the specific determination process is similar to the method of determining the first dynamic correspondence described above. Specific implementation thereof may thus be found with reference to the foregoing embodiments, and description thereof is not repeated herein.

In this way, the correspondence between the impedance and SOC at each of the data collection moments in the current operating condition may be determined, accurate data is thereby provided for subsequent SOC estimation and SOP estimation, and the accuracy of estimation results is thereby improved.

In some embodiments, according to the second equivalent SOC corresponding to each of the data collection moments in the current operating condition, the assigning the weights to the charging impedance and the discharging impedance includes the following.

The following processes are performed for any of the data collection moments.

Weights are assigned to the charging impedance and the discharging impedance according to the following relations:

$$u1 = k2 \times SOCb + b2,$$

$$u2 = -k2 \times SOCb + (1-b2),$$

where u1 represents the weight corresponding to the charging impedance, u2 represents the weight corresponding to the discharging impedance, k2 and b2 are constants, and SOCb represents the second equivalent SOC at the data collection moment.

Further, the values of k2 and b2 may be set according to actual needs, which are not particularly limited herein. Certainly, k1 and k2 may be the same or different, and b1 and b2 may also be the same or different, which can be set according to actual needs.

Based on the same inventive concept, an embodiment of the disclosure provides a SOC determination apparatus for a battery system. The implementation principle of the determination device is similar to that of the foregoing determination method. Description of the specific implementation of the determination apparatus may be found with reference to the specific embodiments of the foregoing determination method and thus is not repeated herein.

Figure 4:
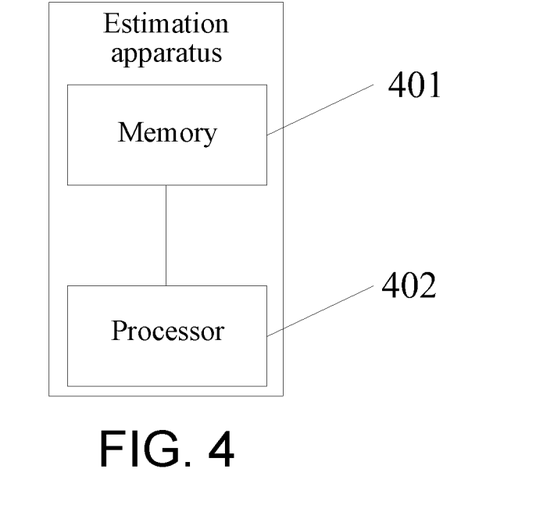
FIG. 4 is a schematic structural view of a SOC determination apparatus for a battery system according to an embodiment of the disclosure.

To be specific, an embodiment of the disclosure provides a SOC determination apparatus for a battery system, and as shown in FIG. 4, the apparatus may include a memory 401 and a processor 402.

The memory 401 is configured to store a program instruction.

The processor 402 is configured to call the program instruction stored in the memory 401 and executes the determination method provided by the foregoing embodiments of the disclosure according to the obtained program.

Based on the same inventive concept, an embodiment of the disclosure provides a battery system. The SOC of the battery system is determined by using the above determination method provided by the embodiments of the disclosure.

In some embodiments, the battery system may be but not limited to a battery pack.

It will be apparent to those skilled in the art that various modifications and variations can be made to the disclosure without departing from the scope or spirit of the disclosure. In view of the foregoing, it is intended that the disclosure covers modifications and variations provided that they fall within the scope of the following claims and their equivalents.

What is claimed is:

1. A state of charge (SOC) determination method for a battery system equipped in an electric vehicle, comprising:
when a first correspondence between an open-circuit voltage (OCV) and a SOC and a second correspondence between an impedance and the SOC are determined, determining a correction coefficient at a current data collection moment according to the first correspondence, the second correspondence, and an operating current of the battery system at a previous data collection moment before the current data collection moment;
determining the SOC of the battery system at the current data collection moment; and
correcting the SOC at the current data collection moment based on the correction coefficient, such that the electric vehicle travels with the corrected SOC,
wherein the determining the correction coefficient at the current data collection moment according to the first correspondence, the second correspondence, and the operating current of the battery system at the previous data collection moment comprises:
determining a first change slope of the OCV and the SOC and a second change slope of the impedance and the SOC according to the first correspondence and the second correspondence;
determining a product of the second change slope and the operating current of the battery system at the previous data collection moment to obtain a second value; and
determining the correction coefficient at the current data collection moment according to the second value and the first change slope, comprising:
determining the correction coefficient at the current data collection moment through the following formulas:

$$p = \int \left[ \frac{\partial OCV}{\partial SOC} + (1-f) \times I_{k-1} \times \frac{\partial R}{\partial SOC} \right],$$

$$f = \exp(T/\tau),$$

where p represents the correction coefficient at the current data collection moment, $I_{k-1}$ represents the operating current of the battery system at the previous data collection moment, $$\frac{\partial OCV}{\partial SOC}$$

represents the first change slope, $$\frac{\partial R}{\partial SOC}$$

represents the second change slope, T represents the time period between two adjacent data collection moments, $\tau$ represents a time constant of resistor-capacitor (RC) loops comprised in an equivalent circuit of the battery system, and $$I_{k-1} \times \frac{\partial R}{\partial SOC}$$

represents the second value.

2. The determination method according to claim 1, wherein the correcting the SOC at the current data collection moment based on the correction coefficient comprises:
looking up the OCV corresponding to the determined SOC from the first correspondence and looking up the impedance corresponding to the determined SOC from the second correspondence;
determining an estimated voltage of the battery system at the current data collection moment according to the looked-up OCV and the impedance;
calculating a difference between the estimated voltage of the battery system at the current data collection moment and an actual measured voltage;
calculating a product of the difference and the correction coefficient to obtain a first value; and
correcting the SOC at the current data collection moment according to the first value.

3. The method according to claim 1, further comprising:
looking up the OCV corresponding to the corrected SOC from the first correspondence and looking up the impedance corresponding to the corrected SOC from the second correspondence; and
determining a state of power (SOP) of the battery system at the current data collection moment according to the looked-up OCV and the impedance.

4. The method according to claim 1, wherein the first correspondence is a first dynamic correspondence among a current operating condition, the OCV, and the SOC determined according to lithium intercalation amounts of a plurality of predetermined positions in an active material of the battery system in the current operating condition, and
the second correspondence is a second dynamic correspondence among the current operating condition, the impedance, and the SOC determined according to the lithium intercalation amounts of the plurality of predetermined positions in the active material of the battery system in the current operating condition, wherein the first dynamic correspondences corresponding to different operating conditions are different, and the second dynamic correspondences corresponding to different operating conditions are different.

5. A SOC determination apparatus for a battery system, comprising:
- a memory configured to store a program instruction; and
- a processor configured to call the program instruction stored in the memory and execute the method according to claim 1 according to the obtained program.

6. A battery system, wherein the SOC of the battery system is determined by using the method according to claim 1.

7. The determination method according to claim 2, wherein the correcting the SOC at the current data collection moment according to the first value comprises:
- calculating a sum of the first value and the SOC at the current data collection moment.

8. The determination method according to claim 4, further comprising:
- according to the lithium intercalation amounts of the plurality of predetermined positions in the active material of the battery system in the current operating condition, determining the first dynamic correspondence among the current operating condition, the OCV, and the SOC determined, comprising:
- when the operating condition comprises at least one of data collection moments, according to the SOC of the battery system at an initial moment of the current operating condition and characteristic parameters used to characterize the characteristics of the active material and an electrode structure, determining the SOC corresponding to the lithium intercalation amount of each of the plurality of predetermined positions at each of the data collection moments under the current operating condition, wherein the plurality of predetermined positions are determined according to a particle size of the active material, a particle size distribution of the particles, and kinetic parameters of the active material;
- according to the SOC corresponding to the lithium intercalation amount of each of the plurality of predetermined positions at each of the data collection moments under the current operating condition, determining an equivalent SOC of the battery system corresponding to each of the data collection moments in the current operating condition; and
- according to the equivalent SOC of the battery system corresponding to each of the data collection moments in the current operating condition, determining the first dynamic correspondence among the current operating condition, the OCV, and the SOC.

9. The determination method according to claim 4, further comprising:
- according to the lithium intercalation amounts of the plurality of predetermined positions in the active material of the battery system in the current operating condition, determining the second dynamic correspondence among the current operating condition, the impedance, and the SOC, comprising:
- when the operating condition comprises at least one of data collection moments, according to the SOC of the battery system at an initial moment of the current operating condition and characteristic parameters used to characterize the characteristics of the active material and an electrode structure, determining the SOC corresponding to the lithium intercalation amount of each of the plurality of predetermined positions at each of the data collection moments under the current operating condition, wherein the plurality of predetermined positions are determined according to a particle size of the active material, a particle size distribution of the particles, and kinetic parameters of the active material;
- according to the SOC corresponding to the lithium intercalation amount of each of the plurality of predetermined positions at each of the data collection moments under the current operating condition, determining an equivalent SOC of the battery system corresponding to each of the data collection moments in the current operating condition; and
- according to the equivalent SOC of the battery system corresponding to each of the data collection moments in the current operating condition, determining the second dynamic correspondence among the current operating condition, the impedance, and the SOC.

10. The determination method according to claim 8, wherein according to the equivalent SOC of the battery system corresponding to each of the data collection moments in the current operating condition, the determining the first dynamic correspondence among the current operating condition, the OCV, and the SOC comprises:
- when the equivalent SOC comprises a first equivalent SOC and a second equivalent SOC, from a predetermined third correspondence between the OCV and the SOC, looking up a charging OCV in a charging process and a discharging OCV in a discharging process corresponding to the first equivalent SOC at each of the data collection moments in the current operating condition, wherein the third correspondences under different operating conditions are the same;
- assigning weights to the charging OCV and the discharging OCV according to the second equivalent SOC corresponding to each of the data collection moments in the current operating condition;
- calculating a product of the charging OCV and the corresponding weight to obtain a third value and calculating a product of the discharging OCV and the corresponding weight to obtain a fourth value;
- treating a sum of the third value and the fourth value as the OCV corresponding to each of the data collection moments in the current operating condition; and
- establishing a dynamic correspondence among the current operating condition, the OCV, and the SOC when the SOC at each of the data collection moments in the current operating condition is determined.

11. The method according to claim 8, wherein according to the SOC of the battery system at the initial moment of the current operating condition and the characteristic parameters used to characterize the characteristics of the active material and the electrode structure, the determining the SOC corresponding to the lithium intercalation amount of each of the plurality of predetermined positions at each of the data collection moments under the current operating condition comprises:
- determining a charge distribution rule for each of the plurality of predetermined positions according to the characteristic parameters used to characterize the characteristics of the active material and the electrode structure;
- defining a time period between the initial moment of the current operating condition and the data collection moment as a data collection period when the current operating condition comprises one data collection period, defining both the time periods between the initial moment of the current operating condition and the first data collection moment and between any adjacent two data collection moments as the data collection period when the current operating condition comprises a plurality of the data collection moments, and determining a total charge change amount during each of the data collection periods in the current operating condition;

determining a charge change amount of each of the plurality of predetermined positions during each of the data collection periods in the current operating condition according to the total charge change amount during each of the data collection periods in the current operating condition and the charge distribution rule of each of the plurality of predetermined positions; and determining the SOC corresponding to the lithium intercalation amount of each of the plurality of predetermined positions at each of the data collection moments under the current operating condition according to the SOC of the battery system at the initial moment of the current operating condition and the charge change amount of each of the plurality of predetermined positions during each of the data collection periods in the current operation condition.

12. The determination method according to claim 9, wherein according to the equivalent SOC of the battery system corresponding to each of the data collection moments in the current operating condition, the determining the second dynamic correspondence among the current operating condition, the impedance, and the SOC comprises:

when the equivalent SOC comprises a first equivalent SOC and a second equivalent SOC, from a predetermined fourth correspondence between the impedance and the SOC, looking up a charging impedance in a charging process and a discharging impedance in a discharging process corresponding to the first equivalent SOC at each of the data collection moments in the current operating condition, wherein the fourth correspondences under different operating conditions are the same;

assigning weights to the charging impedance and the discharging impedance according to the second equivalent SOC corresponding to the current operating condition;

calculating a product of the charging impedance and the corresponding weight to obtain a third value and calculating a product of the discharging impedance and the corresponding weight to obtain a fourth value;

treating a sum of the third value and the fourth value as the impedance corresponding to each of the data collection moments in the current operating condition; and establishing a second dynamic correspondence among the current operating condition, the impedance, and the SOC when the SOC at each of the data collection moments in the current operating condition is determined.

13. The method according to claim 9, wherein according to the SOC of the battery system at the initial moment of the current operating condition and the characteristic parameters used to characterize the characteristics of the active material and the electrode structure, the determining the SOC corresponding to the lithium intercalation amount of each of the plurality of predetermined positions at each of the data collection moments under the current operating condition comprises:

determining a charge distribution rule for each of the plurality of predetermined positions according to the characteristic parameters used to characterize the characteristics of the active material and the electrode structure;

defining a time period between the initial moment of the current operating condition and the data collection moment as a data collection period when the current operating condition comprises one data collection period, defining both the time periods between the initial moment of the current operating condition and the first data collection moment and between any adjacent two data collection moments as the data collection period when the current operating condition comprises a plurality of the data collection moments, and determining a total charge change amount during each of the data collection periods in the current operating condition;

determining a charge change amount of each of the plurality of predetermined positions during each of the data collection periods in the current operating condition according to the total charge change amount during each of the data collection periods in the current operating condition and the charge distribution rule of each of the plurality of predetermined positions; and determining the SOC corresponding to the lithium intercalation amount of each of the plurality of predetermined positions at each of the data collection moments under the current operating condition according to the SOC of the battery system at the initial moment of the current operating condition and the charge change amount of each of the plurality of predetermined positions during each of the data collection periods in the current operation condition.

14. The method according to claim 9, wherein according to the SOC corresponding to the lithium intercalation amount of each of the plurality of predetermined positions at each of the data collection moments under the current operating condition, the determining the equivalent SOC of the battery system corresponding to each of the data collection moments in the current operating condition comprises:

performing the following processes for any of the data collection moments:

assigning a weight to the SOC corresponding to the lithium intercalation amount of each of the plurality of predetermined positions at the data collection moment according to a predetermined first weight distribution rule, calculating a product of the SOC corresponding to the lithium intercalation amount of each of the plurality of predetermined positions at the data collection moment and the corresponding weight, calculating a sum of the products corresponding to the plurality of predetermined positions at the data collection moment to obtain a first value; treating the first value as a first equivalent SOC of the battery system corresponding to the data collection moment; and assigning a weight to the SOC corresponding to the lithium intercalation amount of each of the plurality of predetermined positions at the data collection moment according to a predetermined second weight distribution rule, calculating a product of the SOC corresponding to the lithium intercalation amount of each of the plurality of predetermined positions at the data collection moment and the corresponding weight, calculating a sum of the products corresponding to the plurality of predetermined positions at the data collection moment to obtain a second value; treating the second value as a second equivalent SOC of the battery system corresponding to the data collection moment, wherein the first weight distribution rule is determined according to a degree of contribution of each of the plurality of predetermined positions to the SOC of the battery system, and the second weight distribution rule is determined according to a degree of influence of each of the plurality of predetermined positions on an electrochemical reaction of the battery system.

15. The method according to claim 8, wherein according to the SOC corresponding to the lithium intercalation amount of each of the plurality of predetermined positions at each of the data collection moments under the current operating condition, the determining the equivalent SOC of the battery system corresponding to each of the data collection moments in the current operating condition comprises:

performing the following processes for any of the data collection moments:

assigning a weight to the SOC corresponding to the lithium intercalation amount of each of the plurality of predetermined positions at the data collection moment according to a predetermined first weight distribution rule, calculating a product of the SOC corresponding to the lithium intercalation amount of each of the plurality of predetermined positions at the data collection moment and the corresponding weight, calculating a sum of the products corresponding to the plurality of predetermined positions at the data collection moment to obtain a first value; treating the first value as a first equivalent SOC of the battery system corresponding to the data collection moment; and assigning a weight to the SOC corresponding to the lithium intercalation amount of each of the plurality of predetermined positions at the data collection moment according to a predetermined second weight distribution rule, calculating a product of the SOC corresponding to the lithium intercalation amount of each of the plurality of predetermined positions at the data collection moment and the corresponding weight, calculating a sum of the products corresponding to the plurality of predetermined positions at the data collection moment to obtain a second value; treating the second value as a second equivalent SOC of the battery system corresponding to the data collection moment, wherein the first weight distribution rule is determined according to a degree of contribution of each of the plurality of predetermined positions to the SOC of the battery system, and the second weight distribution rule is determined according to a degree of influence of each of the plurality of predetermined positions on an electrochemical reaction of the battery system.

* * * * *